Aug. 18, 1964 A. M. GINDI 3,145,308

MONOSTABLE MULTIVIBRATOR WITH EARLY RESET IF DESIRED

Filed Nov. 30, 1960

INVENTOR
ABRAHAM M. GINDI
BY Gunter A. Hauptman
ATTORNEY

United States Patent Office 3,145,308
Patented Aug. 18, 1964

3,145,308
MONOSTABLE MULTIVIBRATOR WITH EARLY RESET IF DESIRED

Abraham M. Gindi, Poughkeepsie, N.Y., assignor to International Business Machines Corporation, New York, N.Y., a corporation of New York
Filed Nov. 30, 1960, Ser. No. 72,766
5 Claims. (Cl. 307—88.5)

This invention relates to electronic circuitry and more particularly to high power transistor circuits, usable for driving hammers in a printer.

The hammers of electro-mechanical printers are driven by solenoid coils requiring pulses of high current and short duration. The pulse required to drive the solenoid coil for each hammer is initiated by a set input pulse and is terminated by a reset input pulse. The nominal duty cycle (defined as the ratio of the time current flows to the total time) is calculated to provide for the longest possible output pulse flowing through the hammer coils. This pulse may be of indefinitely long duration since the reset input pulse may fail to occur due to failure of the power driver or connected circuitry. Therefore, in prior devices the only safe design is based on a duty cycle of 100 percent, since fuses alone are not sufficiently reliable. This requires the utilization of expensive and bulky sinks to dissipate the heat generated by the high current flowing through a transistor for the period of time estimated as the worst possible case. In addition large resistors and other components must be provided to handle the high energy transfers required.

The present invention overcomes the disadvantages inherent in prior art circuits and permits power driver circuits to be designed for a duty cycle calculated from the ratio of the actual required ON time to the total time instead of the worst possible case. Such a circuit may be used in a matrix configuration, each point on the matrix being selected for setting by the coincidence of pulses on set and set-gate inputs; or for resetting, by the coincidence of pulses on reset and reset-gate inputs. This allows a more accurate timing of the output pulses as well as better uniformity of pulse widths, resulting in better character registration and more uniform printing density.

A principal object of the invention is to provide apparatus permitting the design of cyclically operable circuitry for intermittent operation.

Another object of this invention is to provide circuitry having a duty cycle which permits utilization of relatively inexpensive components.

Still another object is to permit a high power solenoid coil driver circuit to be set to generate an output pulse determined by a set and a reset pulse which output pulse is limited in duration by internal circuit means independent of said reset pulse.

Another object of this invention is to provide circuitry for generating a high power output pulse initiated by a low power set input pulse and terminated by a low power reset input pulse and terminated by means other than said reset input pulse when said reset input does not occur within a predetermined time interval.

A still further object of this invention is to provide apparatus for generating an output pulse based upon an initiating set input pulse and a terminating reset input pulse and means to terminate said output pulse when said reset input pulse does not occur, wherein the set input pulse circuitry and reset input pulse circuitry are independent of each other in operation.

Another object of this invention is to provide circuitry, combining a fast reacting trigger circuit with a power driver circuit whereby an output pulse of long duration can be turned ON or turned OFF by set and reset pulses of short duration so as to have a high power gain combined with a trigger circuit.

The foregoing and other objects, features and advantages of the invention will be apparent from the following more particular description of a preferred embodiment of the invention, as illustrated in the accompanying drawings.

These objects are achieved by apparatus including a bistable circuit that can be turned ON by a short input set pulse and that can be turned OFF by a short input reset pulse, the set and reset pulses each being gated by gate inputs to facilitate the use of this circuit in a matrix selection system. In the absence of a reset pulse, the circuit acts as a mono-stable oscillator and turns itself OFF before any of the components can overheat. The apparatus may therefore be viewed as either a bistable circuit, modified to act as a mono-stable circuit after a fixed period has passed; or, as a mono-stable circuit, modified to act as a bistable circuit before said fixed period has passed. More particularly, two cross-coupled inexpensive low power transistors drive a third high power transistor. The cross-coupled transistors are both set to a conductive ON state by the coincidence of a set gate applied to a resistor and a set pulse applied to a capacitor through a diode. The third transistor is made conductive when the two transistors are both conductive, causing 5 amperes to flow through the coils of a hammer coil. The two cross-coupled transistors are set to the non-conductive OFF state by the coincidence of a reset gate signal applied to a resistor and a reset pulse signal applied to a diode through a capacitor. When the two cross-coupled transistors become non-conductive the third transistor also becomes non-conductive interrupting the aforesaid 5 amperes current flow. If the reset pulse does not occur within a given time a capacitor, forming part of the cross-coupling network between the two cross-coupled transistors, causes the transistors to assume the non-conductive state interrupting the aforesaid current through the hammer coil.

Therefore, a high current is initiated through a hammer coil by a low current set input pulse applied to special input gating circuitry. The high current output pulse is terminated by a low current reset input pulse applied to special input gating circuitry. The high current output is terminated by cross-coupling circuitry in the event that the reset input signal does not occur. In this manner only the last transistor through which the high current must flow need be an expensive high power transistor. Further, since the automatic reset feature permits the actual duty cycle to equal the theoretical duty cycle (the ratio of the ON time to the total time), bulky heat dissipating apparatus and expensive components are not necessary.

Figure 1:
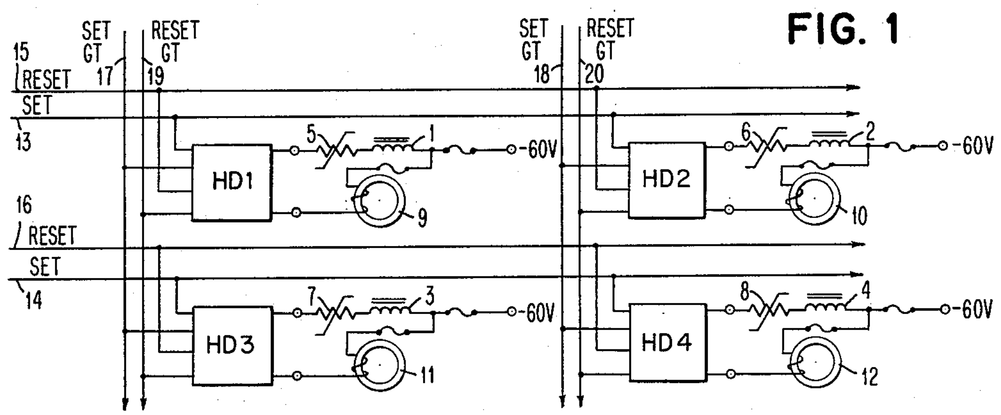
FIG. 1 is a block diagram showing the arrangement of several power driver circuits to supply current to an equal number of hammer coils.

Referring to FIG. 1 there are shown four blocks HD1, HD2, HD3 and HD4, each representing one hammer driver circuit, of a larger number of hammer driver circuits, provided to drive a corresponding number of hammer coils 1, 2, 3 and 4 through the non-linear resistances 5, 6, 7 and 8. The cores 9, 10, 11 and 12 are provided to indicate whether a hammer coil was to have been operated. Proper fusing is provided in each line. Set pulses are supplied on input lines 13 and 14 and reset pulses are provided on input lines 15 and 16. Set gate signals are supplied on input lines 17 and 18 and reset gate signals are supplied on input lines 19 and 20. The coincidence of a set pulse signal on line 13 or 14 and a set gate signal on line 17 or 18 causes the corresponding hammer coil 1, 2, 3 or 4 to be activated. The coincidence of a reset pulse on lines 15 or 16 and a reset gate signal on line 19 or 20 deactivates the corresponding one of the hammer coils 1, 2, 3 or 4. In this manner individual ones of a large number of hammer coils may be operated by the coincidence of signals on corresponding ones of gate and pulse input lines.

Figure 2:
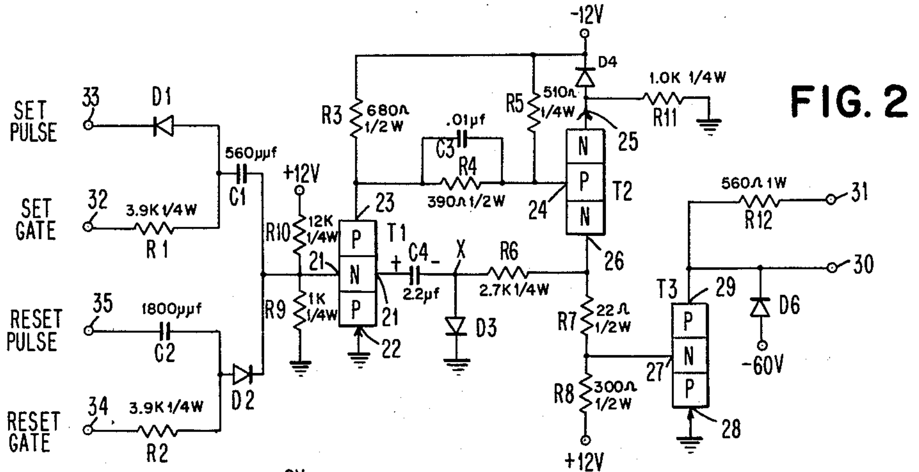
FIG. 2 is a detailed circuit diagram of apparatus embodying the invention.

Referring to FIG. 2, a typical one of the hammer driver circuits is shown in detail. PNP transistor T1 has a base 21, an emitter 22 and a collector 23. The NPN transistor T2 has a base 24, an emitter 25 and a collector 26. These transistors are relatively inexpensive since they handle a reasonably low current. For example, in the specific circuit shown, transistor T1 must be rated for approximately 50 ma. and transistor T2 must be rated for approximately 500 ma.; whereas, the output current in the hammer driver solenoid is 5 amperes. The PNP transistor T3 has a base 27, an emitter 28 and a collector 29. This transistor T3 is preferably chosen for intermittent operation to decrease cost. In the particular embodiment of the invention disclosed in this application transistor T3 is chosen to operate for a 1.1 percent duty cycle eliminating the need of a heat sink and other heat dissipating components.

The base 21 of the transistor T1 is biased by means of the voltage divider formed by the resistors R9 and R10 connected between ground and +12 volts. The emitter 22 of the transistor T1 is connected to ground. The collector 23 of the transistor T1 is connected to −12 volts through the resistor R3. The base 24 of the transistor T2 is biased by means of the resistor R5 connected to −12 volts. The emitter 25 of the transistor T2 is biased by means of the diode D4 and the resistor R11 connected between −12 volts and ground. The diode D4 is always maintained in its forward conduction region. The base 27 of the transistor T3 is biased by the resistor R8 connected to +12 volts. The emitter 28 of the transistor T3 is connected to ground. The collector 29 of the transistor T3 is connected to output terminal 31 through the resistor R12 and to output terminal 30. The core connected to output terminal 31 and the hammer coil connected to output 30 are each connected to −60 volts. The diode D6 is connected between the collector 29 of the transistor T3 and −60 volts to clamp the output terminal 30 at −60 volts.

The terminal 32 for receiving set gate signals is normally held at −12 volts and the terminal 33 for receiving set pulse signals is normally held at 0 volts. As long as the terminal 32 is held at −12 volts, voltage variations at terminal 33 will not be transmitted to the base 21 of the transistor T1 because the diode D1 is not in the conductive state. If the terminal 33 is held at 0 volts, voltage variations at the terminal 32 will not cause variations of the base 21 voltage T1 due to the long time constant of the R1–C1 circuit. But, if terminal 32 is set to 0 volts at the same time that terminal 33 is set to −12 volts then the diode D1 is made forward conducting and a −12 volt pulse is applied to the base 21 of the transistor T1. The −12 volt pulse cannot reach hammer driver circuits connected to the reset gate terminal 34 and the reset pulse terminal 35 because at this time the reset gate terminal 34 is set to −12 volts holding the diode D2 in the non-conductive condition, blocking the −12 volt pulse from leaving the circuit by means of terminal 35.

The reset gate signal input terminal 34 is normally maintained at −12 volts. The reset pulse signal input terminal 35 is normally maintained at −12 volts also. As long as the terminal 34 is maintained at −12 volts, voltage variations at terminal 35 will not be applied to the base 21 of the transistor T1 because the diode D2 is held in a non-conductive state. If the terminal 35 is maintained at −12 volts, variations in the signal applied to the terminal 34 will not be transferred to the base 21 of the transistor T1, the diode D2 being held non-conductive by the base potential of about 0 volt present when transistor T1 is ON. However, if the terminal 34 is set to 0 volts and the terminal 35 is changed from −12 to 0 volts the resulting +12 volt pulse will drive diode D2 into the forward conducting region, which pulse will be sufficient to change the state of the transistor T1 from the conductive ON to the non-conductive OFF state. This signal will not be propagated to the set pulse and set gate circuitry of other hammer drivers because the set gate terminal 32 is at this time −12 volts holding diode D1 conductive preventing the +12 volt pulse from leaving at the terminal 33.

The collector 23 of the transistor T1 is connected to the base 24 of transistor T2 through the parallel capacitor C3 and resistor R4. If a negative pulse is applied at base 21 of transistor T1 a positive pulse leaves the collector 23 and is applied to the base 24 of the transistor T2. The collector 26 of the transistor T2 is connected to the base 21 of the transistor T1 by means of a series resistor R6 and capacitor C4. When the transistor T2 is in a non-conductive state the point X between the resistor R6 and capacitor C4 is held at approximately ground potential by the diode D3 due to the +12 volt source connected to the resistor R8. After a negative pulse is applied at base 21 of transistor T1 the voltage at point X approaches −12 volts at a rate determined by the time constant of the resistor R6 and the capacitor C4. The effect of this feedback loop is to hold transistor T1 conductive which in turn holds transistor T2 conductive, as long as the capacitor C4 is charging. The base 27 of the transistor T3 is connected to the collector 26 of the transistor T2 by means of resistor R7. As a result the base 27 of the transistor T3 soon reaches a value sufficient to provide the output current from the collector 29 of the transistor T3.

If a positive pulse appears at base 21 of transistor T1, while the capacitor C4 is still charging, a negative pulse leaves the collector 23 of the transistor T1 and enters the base 24 of the transistor T2. The effect of this is to make the transistors T1 and T2 less conductive causing a decrease in current at the collector 26 of the transistor T2 which is applied to the base 27 of the transistor T3 cutting off the output current flow from the collector 29 of the transistor T3. As the current from the collector 26 of the transistor T2 decreases, the voltage at point X between the resistor R6 and the capacitor C4 increases toward +12 volts at a rate determined by the capacitor C4 and the transistors R6, R7 and R8. When the potential at point X becomes slightly more than 0 volts, the diode D3 conducts clamping the point X.

If a positive reset signal is not received at the base 21 of the transistor T1 by the time that point X reaches approximately −8 volts (while approaching −12 volts) the current through the capacitor C4 is decreased to a point where the base 21 of the transistor T1 does not receive enough current to maintain the transistor in conduction, whereupon the collector 23 of transistor T1 becomes more negative thereby turning OFF transistor T2 which in turn causes the complete turn OFF of transistor T1, and causes the current flowing through the transistor T3 to be terminated.

Figure 3:
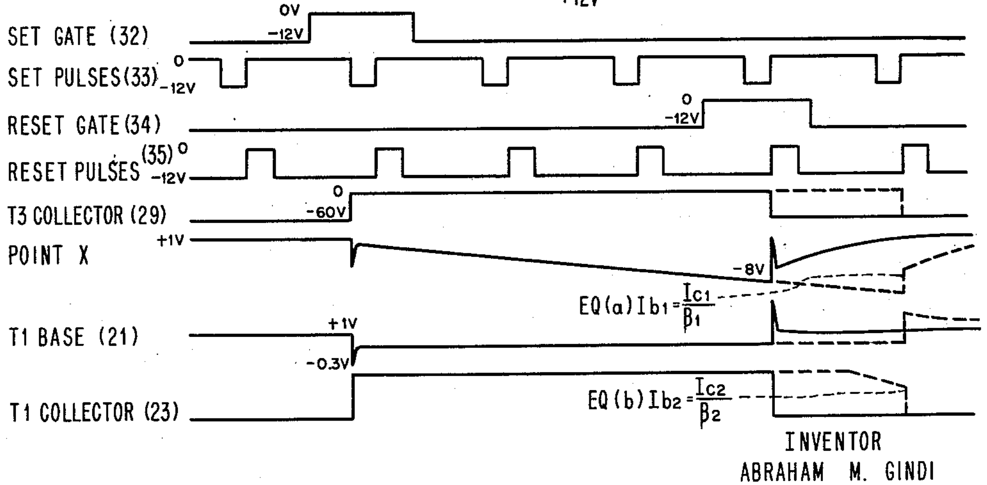
FIG. 3 is a diagram of the waveforms present during operation of the circuit shown in FIG. 2.

The operation of the apparatus illustrated in FIG. 2 is shown by the wave form of FIG. 3. Initially the transistors T1, T2 and T3 are in the non-conductive stage. The base 21 of the transistor T1 is held positive by +12 volts applied to the R9-R10 voltage divider. The base 24 of the transistor T2 is held negative by the −12 volts applied by means of the resistor R5. The base 27 of the transistor T3 is held positive by the +12 volts applied by means of the resistor R8. As long as the terminal 32 remains set to −12 volts, signals applied to the terminal 33 have no effect on the base 21 of the transistor T1. If the terminal 32 is made 0 then when the signal applied at the input terminal 33 becomes −12 a negative pulse will be applied by the capacitor C1 to the base 21 of the transistor T1. The set pulse at terminal 33 is timed to be 1.3 microseconds in duration and to arrive at least 3.9 microseconds after the initiation of the set gate signal on input terminal 32 in this particular embodiment of the invention. As a result the collector potential of the transistor T3 rises from −60 to 0 volts at which time approximately 5 amperes flows through the collector-emitter junction of the transistor T3. Since the capacitor C4 was initially discharged the voltage at point X was clamped at approximately +1 volt above ground (the forward voltage drop of the diode D3 used in this circuit). When the transistor T2 becomes conductive the capacitor C4 charges toward approximately −12 volts, the potential at point X decreasing as shown in FIG. 3.

As long as the reset gate terminal 34 is maintained at −12 volts signals (0 volts) applied at input terminal 35 will not reach the base 21 of the transistor T1 because the diode D2 is held non-conductive. However, when the terminal 34 becomes 0 volts and the terminal 35 also is at 0 volts then a positive pulse will pass through the diode D2 to the base 21 of the transistor T1. The reset pulse applied at terminal 35 is of a duration of 1.3 microseconds timed to occur at least 3.9 microseconds after the beginning of a reset gate signal applied at terminal 34. Whatever potential drop is present across the capacitor C4 at this time cannot be immediately changed since it must discharge through the resistors R6, R7 and R8. As a result the voltage drop at point X immediately increases by the amount of the signal applied at base 21 of the transistor T1. This positive signal causes both transistors T1 and T2 to go out of conduction, transistor T3 being brought out of conduction starting at this time. The current at collector 29 of T3 decreases to 0 amperes as shown in FIG. 3 by the change from 0 volts to −60 volts on the collector of transistor T3. Since the current supply from the transistor T2 is cut off the capacitor C4 discharges slowly, point X approaching a potential of about +1 volt.

If a reset pulse or a reset gate signal does not occur within approximately 1.1 milliseconds of the time that the set pulse initiated output current from the transistor T3, the capacitor C4 charges to a point where the junction X potential is approximately −8 volts. At this time the charge on capacitor C4 has reached a value where very little current is necessary for further charging. As a result the base 21 of the transistor T1 receives insufficient current to maintain full conduction, and the transistors T1, T2 and T3 slowly enter non-conductive states. The effect is the same as if a reset pulse and reset gate had been applied. In FIG. 3, Equations (*a*) and (*b*) indicate the levels at which transistors T1 and T2, successively, begin to pull out of saturation. $I_c$ and $I_b$ are the collector and base currents, respectively, of the designated transistors. B is the transistor current gain between the collector and base of the designated transistor. When both transistors are out of saturation the circuit acts as a multivibrator and quickly shuts OFF.

The above operation may be repeated as soon as the capacitor C4 discharges to 0 volts and the point X again is at about +1 volt, (about 10 milliseconds). However, in order to allow the heat generated during the on time to dissipate, the above operation is repeated at an average of once every 100 milliseconds.

The previous structure and description of operation illustrates one embodiment of apparatus for supplying a high current pulse of power designed for a duty cycle operation, without requiring expensive and bulky mechanical heat dissipation means. This apparatus also permits inputs to a number of circuits by means of a novel set of gating means, said inputs capable of being of relatively short duration and low power.

While the invention has been particularly shown and described with reference to a preferred embodiment thereof, it will be understood by those skilled in the art that various changes in form and details may be made therein without departing from the spirit and scope of the invention.

What is claimed is:

1. Apparatus including: a number of transistors; setting means connected to a first transistor; resetting means connected to said first transistor; circuit means interconnecting said number of transistors; output means connected to a second transistor of said number of transistors; a source of set signals, connected to said setting means, operative in association with said circuit means to cause said transistors to assume a first set of states; a source of reset signals, connected to said resetting means, operative in association with said circuit means to cause said transistors to assume a second set of states immediately; and reactive means, connected between two of said number of transistors operative to cause said transistors to assume said second set of states, a predetermined time after said first set of states are assumed, in the absence of reset signals prior to set predetermined time.

2. Power driving apparatus including: a first, a second and a third transistor, each having a base, an emitter and a collector; bias means connected to selected ones of said bases, emitters and collectors; setting means connected to said first transistor base; resetting means connected to said first transistor base; means connecting said first transistor collector to said second transistor base; means connecting said third transistor base to said second transistor collector; output means connected to said third transistor collector; a source of set signals, connected to said setting means, operative to cause said transistors to assume a first set of states; a source of reset signals, connected to said resetting means, operative to cause said transistors to immediately assume a second set of states; and reactive means, connected between said second transistor collector and said first transistor base operative to cause said transistors to assume said second set of states a predetermined time after said first set of states are assumed in the event that no reset signal occurs prior to said predetermined time.

3. Apparatus set forth in claim 2 wherein: said setting means include a first diode, a first resistor and a first capacitor; and said resetting means include a second diode, a second resistor and a second capacitor.

4. In automatically resettable solid state power driving apparatus, utilizing manual control means, including: a plurality of transistors including a first, second and last transistors each having an input and an output; means interconnecting the inputs and outputs of said first and second transistors; means connecting said second transistor output and said last transistor input; output means connected to said last transistor output; a source of set pulse signals; a source of set gate signals; a source of reset pulse signals; a source of reset gate signals; a first capacitor having a first and second end; a first diode having a first and a second end; means connecting said first capacitor first end to said first transistor input; means connecting said first diode first end to said first transistor input; a second diode interconnecting said first capacitor second end and said set pulse signal source; a first resistor interconnecting said first capacitor second end and said set gate signal source; a second capacitor interconnecting said first diode second end and said reset pulse source; and a second resistor interconnecting said first diode second end and said reset gate input.

5. Power driving apparatus including: a first, a second and a third transistor, each having a base, an emitter and a collector; bias means connected to selected ones of said bases, emitters and collectors; setting means connected to said first transistor base, resetting means connected to said first transistor base; means connecting said first transistor collector to said second transistor base; means connecting said third transistor base to said second transistor collector; output means connected to said third transistor collector; a source of set signals, connected to said setting means, operative to cause said transistors to assume a first set of states; a source of reset signals, connected to said resetting means, operative to cause said transistors to assume a second set of states; reactive means, connected between said second transistor collector and said first transistor base operative to cause said transistors to assume said second set of states a predetermined time after said first set of states are assumed; said setting means include a first diode, a first resistor and a first capacitor; said resetting means include a second diode, a second resistor and a second capacitor; a third diode operable as a bias control connected to said second transistor emitter; and means for maintaining said third diode in a forward conducting state.

References Cited in the file of this patent

UNITED STATES PATENTS

| | | |
|---|---|---|
| 2,414,486 | Rieke | Jan. 21, 1947 |
| 2,562,188 | Hance | July 31, 1951 |
| 2,576,339 | Gray | Nov. 27, 1951 |
| 2,837,663 | Walz | June 3, 1958 |
| 2,937,291 | Harper | May 17, 1960 |
| 2,986,649 | Wray | May 30, 1961 |
| 3,113,219 | Gilmore | Dec. 3, 1963 |